(12) United States Patent
Tang et al.

(10) Patent No.: US 12,585,420 B2
(45) Date of Patent: Mar. 24, 2026

(54) AUDIO SWITCH WITH TURN-OFF HELPER FOR DIGITAL INTERFACE

(71) Applicant: QUALCOMM Incorporated, San Diego, CA (US)

(72) Inventors: Dongyang Tang, San Diego, CA (US); Ramkumar Sivakumar, San Diego, CA (US); Khaled Mahmoud Abdelfattah Aly, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 84 days.

(21) Appl. No.: 18/072,603

(22) Filed: Nov. 30, 2022

(65) Prior Publication Data

US 2024/0176574 A1    May 30, 2024

(51) Int. Cl.
*G06F 3/16* (2006.01)
*G06F 13/38* (2006.01)
*H03K 17/687* (2006.01)

(52) U.S. Cl.
CPC .............. *G06F 3/162* (2013.01); *G06F 13/38* (2013.01); *H03K 17/6871* (2013.01); *G06F 2213/0042* (2013.01)

(58) Field of Classification Search
CPC .......... G06F 3/162; G06F 3/165; G06F 3/167; G06F 2213/0042; G06F 13/38; H03K 17/6871; H03H 11/34
See application file for complete search history.

(56) References Cited

U.S. PATENT DOCUMENTS

2021/0184667 A1    6/2021    Hayashi et al.
2022/0130819 A1*   4/2022    Chen ................... H01L 27/0266
2022/0376679 A1*   11/2022   Huang .................. H03H 11/34

FOREIGN PATENT DOCUMENTS

EP          4044441 A1    8/2022

OTHER PUBLICATIONS

International Search Report and Written Opinion—PCT/US2023/081005—ISA/EPO—Mar. 18, 2024.

* cited by examiner

*Primary Examiner* — Ernest Unelus
(74) *Attorney, Agent, or Firm* — Loza & Loza LLP

(57) ABSTRACT

An integrated circuit is provided with a terminal that functions to pass a data signal during a high-speed data mode of operation and to pass an audio signal during an audio mode of operation. The integrated circuit includes an audio source that couples to the terminal through an audio pass transistor during the audio mode of operation. To maintain the audio pass transistor off during the high-speed data mode of operation, the integrated circuit includes a first transistor coupled between the terminal and a gate of the audio pass transistor. The first transistor conducts negative charge from the terminal to the gate of the audio pass transistor.

13 Claims, 4 Drawing Sheets

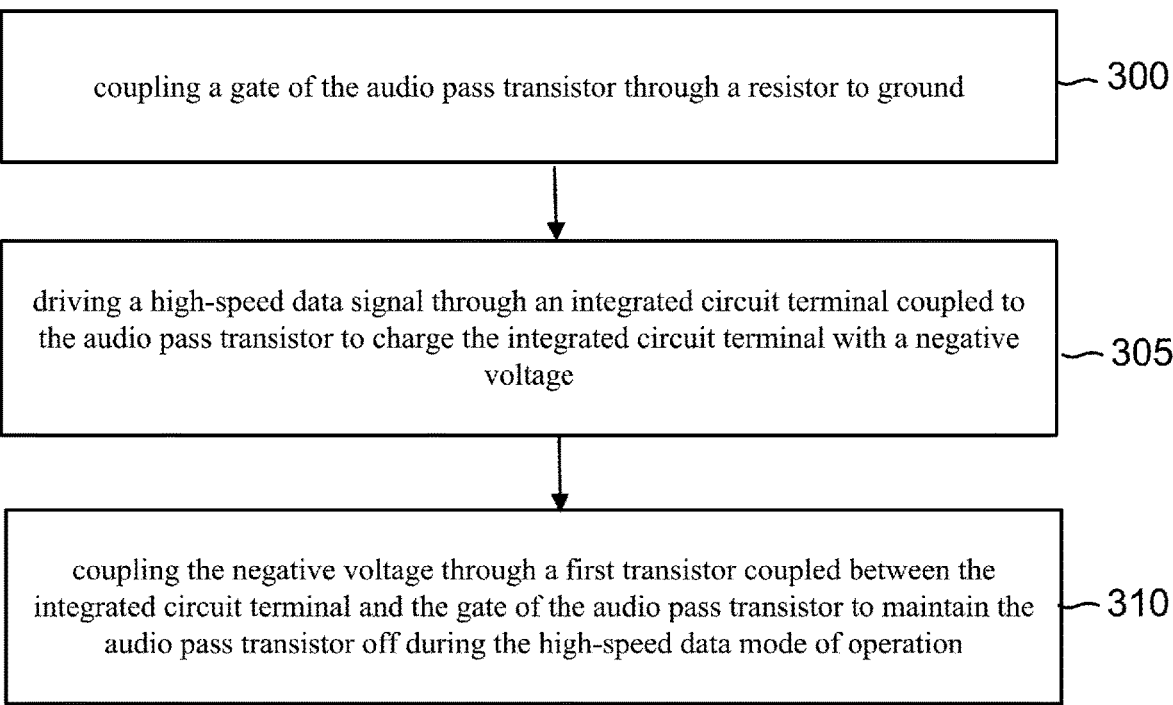

coupling a gate of the audio pass transistor through a resistor to ground    — 300 driving a high-speed data signal through an integrated circuit terminal coupled to the audio pass transistor to charge the integrated circuit terminal with a negative voltage    — 305 coupling the negative voltage through a first transistor coupled between the integrated circuit terminal and the gate of the audio pass transistor to maintain the audio pass transistor off during the high-speed data mode of operation    — 310

FIG. 3

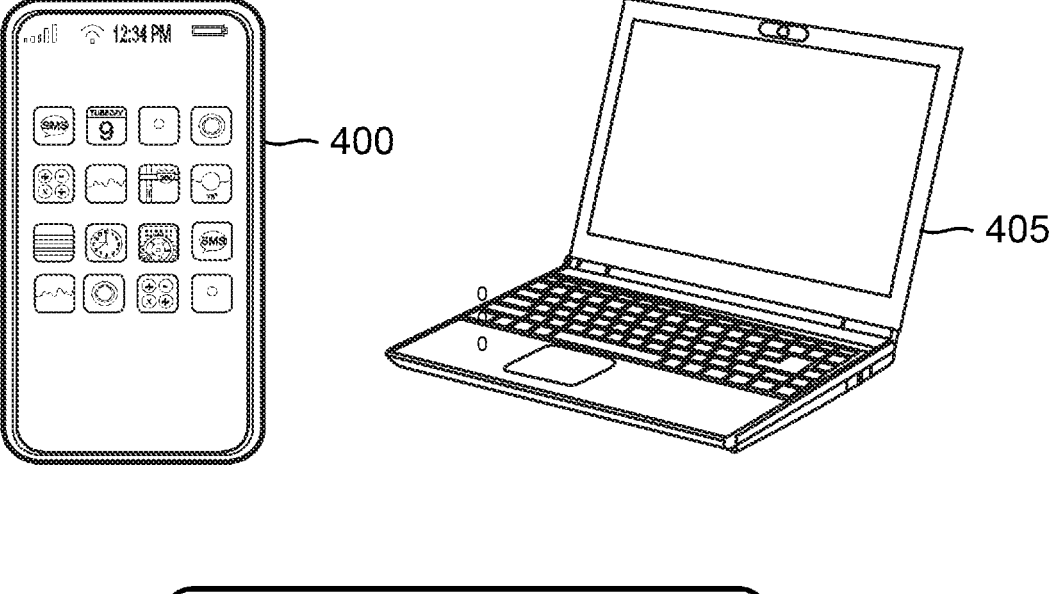
400
405
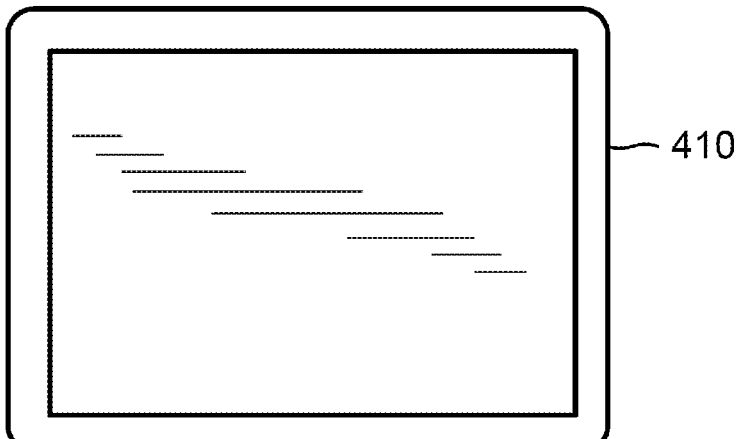
410
FIG. 4

AUDIO SWITCH WITH TURN-OFF HELPER FOR DIGITAL INTERFACE

TECHNICAL FIELD

This application relates to digital interface switches, and more particularly, to an improved switch between an audio source and a digital interface.

BACKGROUND

A common type of digital interface that enables digital communication between devices is a universal serial bus (USB) interface. There are various types of USB protocols such as a USB Type C (USB-C) interface that is found on smartphones and other digital devices. For example, a smartphone typically can interface through its USB-C port or interface to other devices such an automobile (e.g., to use Android Auto) or a battery charger. To minimize the number of ports on a smartphone, one other use for the USB-C port is to couple to headphones. In this fashion, a device need not include a separate headphone jack but instead may couple through its USB-C port. A USB-C port may thus be supplying audio signals to a headphone in an audio mode of operation or be providing high-speed digital data in a high-speed data mode of operation to some other device. This sharing of the audio interface with the high-speed digital signaling may be problematic due to the relatively large capacitance of the audio signal source and the associated audio switch.

SUMMARY

In accordance with an aspect of the disclosure, an integrated circuit is provided that includes: an integrated circuit terminal; an audio pass transistor having a first drain/source terminal coupled to the integrated circuit terminal; and a first transistor having a first drain/source terminal coupled to a gate of the audio pass transistor and having a second drain/source terminal coupled to the integrated circuit terminal.

In accordance with another aspect of the disclosure, a method of controlling an audio pass transistor is provided that includes: during a high-speed data mode of operation: coupling a gate of the audio pass transistor through a resistor to ground; driving a high-speed data signal through an integrated circuit terminal coupled to the audio pass transistor to charge the integrated circuit terminal with a negative voltage; and coupling the negative voltage through a first transistor coupled between the integrated circuit terminal and the gate of the audio pass transistor to maintain the audio pass transistor off during the high-speed data mode of operation.

In accordance with yet another aspect of the disclosure, integrated circuit is provided that includes: an integrated circuit terminal; an audio source for an audio signal; an audio pass transistor coupled between the audio source and the integrated circuit terminal; a resistor coupled to ground; a first switch configured to couple a gate of the audio pass transistor to ground through the resistor during a high-speed data mode of operation for the integrated circuit; and means for coupling a negative charge on the integrated circuit terminal to a gate of the audio pass transistor during the high-speed data mode of operation.

These and other advantageous features may be better appreciated through the following detailed description.

BRIEF DESCRIPTION OF THE DRAWINGS

FIG. 3 is a flowchart of a method of controlling an audio pass transistor in accordance with an aspect of the disclosure.

FIG. 4 illustrates some example electronic devices including an audio pass transistor turn-off circuit in accordance with an aspect of the disclosure.

Implementations of the present disclosure and their advantages are best understood by referring to the detailed description that follows. It should be appreciated that like reference numerals are used to identify like elements illustrated in one or more of the figure.

DETAILED DESCRIPTION

Figure 1:
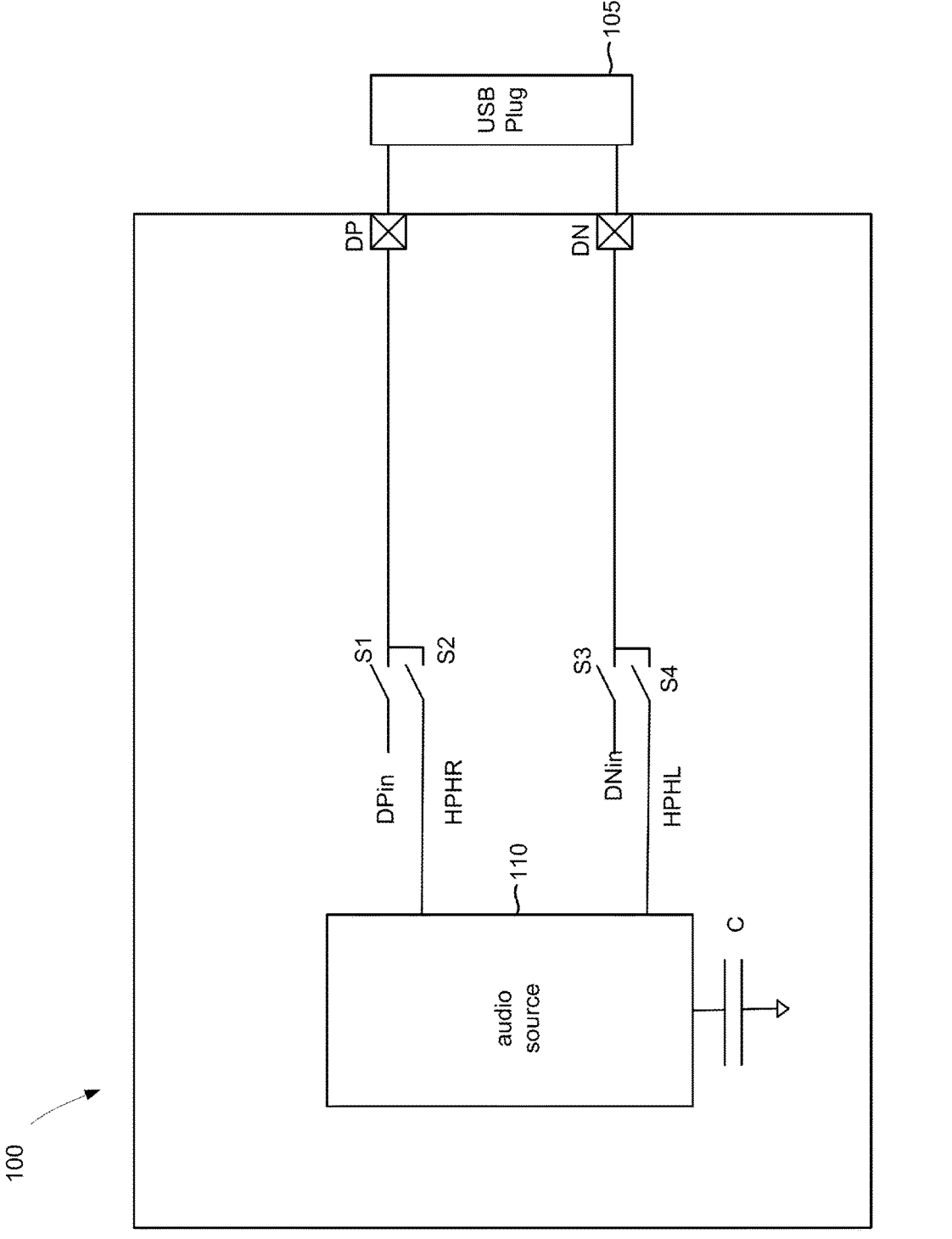
FIG. 1 is a high-level block diagram of an integrated circuit including an audio pass transistor turn-off circuit in accordance with an aspect of the disclosure.

An integrated circuit 100 is shown in FIG. 1 in which an integrated circuit terminal is used both in an audio mode of operation and in a high-speed data mode of operation. In the following example implementations, the high-speed data mode of operation is a USB mode of operation such as a USB-C mode of operation, but it will be appreciated that any suitable high-speed data mode of operation may be utilized herein. The USB interface of integrated circuit 100 includes a data positive (DP) terminal and a data negative (DN) terminal. The DP and DN terminals may also be designated as pins. An external device (not illustrated) such as a user headphone couples to the DP and DN terminals through a USB plug 105.

In the high-speed data mode of operation, a controller (not illustrated) in integrated circuit 100 closes a data switch S1 to couple a data positive in (DPin) signal to the DP terminal. Similarly, the controller closes a data switch S3 to couple a data negative in (DNin) signal to the DN terminal. During the audio mode of operation, the controller closes an audio switch S2 so that a headphone right (HPHR) signal from an audio source 110 may couple through switch S2 to the DP terminal. In the same fashion, the controller closes an audio switch S4 so that a headphone left (HPHL) signal from audio source 110 may couple through switch S4 to the DN terminal. During the audio mode of operation, data switches S1 and S3 are open. Similarly, audio switches S2 and S4 are open during the high-speed mode of operation.

The data rate in the USB-C protocol for the high-speed data mode of operation may be well over 1 billion bits per second. Such a high-speed data transfer is sensitive to the capacitive loading of the DP and DN terminals. For example, the DP and DN terminals are typically protected by electrostatic discharge (ESD) diodes that may capacitively load each of the terminals with tens of pico-Farads. Ideally, the opening of the audio switches S2 and S4 isolates the DP and DN terminals from any capacitive loading from audio source 110. However, audio switches S2 and S4 are typically constructed from n-type metal-oxide-semiconductor (NMOS) audio pass transistors. An audio signal such as HPHR or HPHL may oscillate between positive and negative voltages. The current direction through an audio pass transistor may thus either be directed towards an integrated circuit terminal or from the integrated circuit terminal. What is a drain versus what is a source of the audio pass transistor will thus vary depending upon the polarity of the audio signal. The following discussion will therefore refer to drain/source terminals of the audio pass transistor as each such terminal may function both as a drain and as a source. A first drain/source terminal of the audio pass transistor couples to its respective DP or DN terminal whereas a second drain/source terminal of the audio pass transistor couples to an audio source 110. The USB specification requires a system to be able to support a negative common-mode voltage. Therefore, the DP and DN terminals can swing to a negative voltage. If the gate of the audio pass transistor is merely grounded to switch it off during the high-speed data mode of operation, the gate-to-source voltage of the audio pass transistor will thus be positive should the integrated circuit terminal coupled to the audio pass transistor be discharged to a negative voltage. The resulting gate-to-source voltage may either exceed the audio pass transistor's threshold voltage or be close enough to the threshold voltage such that the audio pass transistor becomes conductive or at least slightly conductive. The audio pass transistor's respective integrated circuit terminal (either the DP or DN terminal) is then capacitively loaded by the audio source 110 as symbolically illustrated by a capacitor C. Given the sensitivity of the high-speed data mode of operation to capacitive loading of the DP and DN terminals, the grounding of the audio pass transistor gate may result in unacceptably high bit error rates.

To prevent the audio source 110 from capacitively loading the DP and DN terminals during the high-speed data mode of operation, the gates of the audio pass transistors forming the audio switches S2 and S4 could be charged with a negative voltage such as from a –1.8 V voltage source (not illustrated). The audio pass transistors thus remain off during the high-speed data mode of operation even when the DN and DP terminals are negatively discharged by the high-speed data signaling. But the negative voltage source would typically be a switching power supply that consumes power and semiconductor die space and also adds to design complexity. Such a negative voltage source would be on not only during the high-speed data mode of operation but also during the audio mode of operation. An audio pass transistor turn-off circuit for integrated circuit 100 is disclosed herein that eliminates the need for such an always-on negative voltage source.

Figure 2:
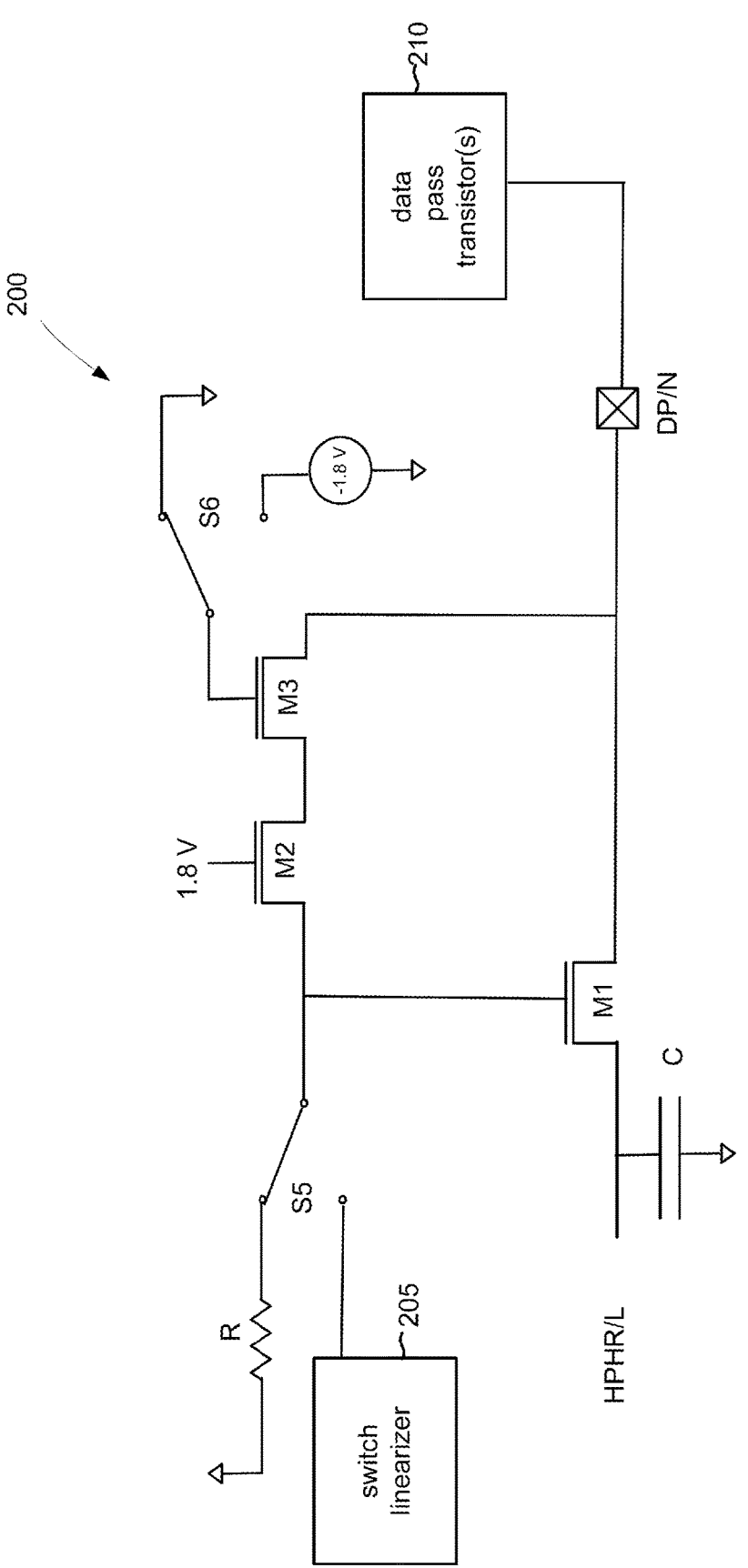
FIG. 2 is a circuit diagram of the audio pass transistor turn-off circuit of the integrated circuit of FIG. 1 in accordance with an aspect of the disclosure.

An example audio pass transistor turn-off circuit 200 is shown in more detail in FIG. 2. A data terminal DP/N is a generic representation of either the integrated circuit terminal DP or DN. An NMOS audio pass transistor M1 has a first source/drain terminal coupled to the data terminal. A second source/drain terminal of the audio pass transistor M1 couples to the audio source 110 (shown in FIG. 1). In the example audio pass transistor turn-off circuit 200, the audio source is represented by its capacitance C. An audio signal HPHR/L is a generic representation of either the HPHR or the HPHL audio signal. During the audio mode of operation, a controller (not illustrated) controls a switch S5 to select a switch linearizer 205 that couples through the switch S5 to a gate of the audio pass transistor M1. Switch linearizer 205 switches on the audio pass transistor M1 so that the audio signal HPHR/L may be linearly passed through the audio pass transistor M1 to the DP/N terminal. Switch S5 is also denoted herein as a first switch.

During the high-speed data mode of operation, the controller controls switch S5 to instead select for a terminal of a resistor R that has a remaining terminal coupled to ground. The gate of transistor M1 is thus coupled to ground through switch S5 and resistor R. But the gate voltage of transistor M1 is not grounded while a negative voltage data signal conducts through the DP/N terminal as will be explained further herein. The integrated circuit terminal DP/N couples through at least one data pass transistor 210 to a data source (not illustrated) that provides a data in signal (e.g., either DPin or DNin as discussed earlier). Depending upon the binary value of the data in signal, the integrated circuit terminal DP/N may be negatively charged during the high-speed data mode of operation. To advantageously use this negative voltage of the integrated circuit terminal DP/N to also negatively charge the gate of the audio pass transistor M1, a turn-off helper NMOS transistor M3 has a first drain/source terminal coupled to the integrated circuit terminal DP/N and a second drain/source terminal coupled to the gate of the audio pass transistor M1. Note that the coupling of the second drain/source terminal to the gate of the audio pass transistor M1 may occur through an NMOS transistor M2 as will be discussed further herein. The turn-off helper transistor M3 is also denoted herein as a first transistor.

A sufficient positive voltage (e.g., 1.8 V) biases a gate of transistor M2. In this fashion, transistor M2 is switched on both during the audio mode of operation and during the high-speed data mode of operation. In the audio mode of operation, switch linearizer 205 drives the gate of the audio pass transistor M1 with a positive voltage such as up to 5.5 V. The audio signal voltage may range between approximately 1.4 V and –1.4 V. Without transistor M2, the drain-to-source voltage across turn-off helper transistor M3 could be approximately 7 V as the audio signal discharges to-1.4 V. Such a relatively large drain-to-source voltage across turn-off helper transistor M3 could damage the transistor. But transistor M2 can only pass its gate voltage of 1.8 V minus its threshold voltage to the adjoining second drain/source terminal of the turn-off helper transistor M3. Turn-off helper transistor M3 is thus protected from damage during the audio mode of operation by the inclusion of transistor M2. In alternative implementations, transistor M2 may be eliminated if the turn-off helper transistor M3 is made robust to such large voltage stresses such as by the use of a suitably thick gate oxide. Turn-off helper transistor M3 and a switch S6 (and optionally transistor M2) may be deemed to constitute a means for coupling a negative charge on an integrated circuit terminal to a gate of an audio pass transistor during the high-speed data mode of operation. Transistor M2 is also denoted herein as a second transistor. Similarly, switch S6 is also denoted herein as a second switch.

During the high-speed data mode of operation, the controller controls switch S5 to select for ground. Similarly, the controller controls a the switch S6 to couple the gate of the turn-off helper transistor M3 to select for ground. The base (not illustrated) of the turn-off helper transistor M3 is also coupled to ground through switch S6 during the high-speed data mode of operation. With the turn-off helper transistor M3 switched on, the resistor R and the on-resistances of transistor M2 and the turn-off helper transistor M3 then form a resistive voltage divider with respect to the negative voltage of the integrated circuit terminal DP/N. As the high-speed data signal swings to a negative voltage such as approximately –250 millivolts, the gate-to-source voltage of the turn-off helper transistor M3 is charged to approximately 250 millivolts, which is greater than the approximately 100 to 200 millivolt threshold voltage of the turn-off helper transistor M3. The turn-off helper transistor M3 thus switches on so that the integrated circuit terminal DP/N is coupled to the gate of the audio pass transistor M1 through the voltage divider formed by resistor R and the on-resistances of transistor M2 and the turn-off helper transistor M3.

The gate voltage of the audio pass transistor M1 is thus discharged negatively such as to −150 to −200 millivolts while the integrated circuit terminal DP/N is negatively charged. Regardless of the exact value of the negative voltage for data signaling used in any specific high-speed data mode of operation, the gate voltage of the audio pass transistor M1 will be pulled to an appreciable fraction of this negative voltage. In this fashion, the audio pass transistor M1 is maintained firmly off during the high-speed data mode of operation such that the integrated circuit DP/N is not loaded with the capacitance from the audio source. The high-speed data mode of operation may thus be practiced without the cost and complication of an always-on negative voltage source.

To keep transistor M2 and the turn-off helper transistor M3 from affecting the audio signaling through the integrated circuit terminal DP/N, switch S6 couples the gate of the turn-off helper transistor M3 (and also its base) to a −1.8 V voltage source during the audio mode of operation. The −1.8 V voltage source may be activated only during the audio mode of operation as it is not needed during the high-speed data mode of operation. In this fashion, the audio pass transistor turn-off circuit 200 does not suffer from the power consumption and complication of an always-on negative voltage source. The −1.8 V voltage source may be constructed using a switching power converter or a switched capacitor circuit. With the gate of the turn-off helper transistor M3 coupled to the −1.8 V voltage source, the gate-to-source voltage of the turn-off helper transistor M3 remains negative even as the audio signal swings the voltage of the integrated circuit terminal DP/N to a negative value such as to −1.4 V. The turn-off helper transistor M3 thus stays firmly off during the audio mode of operation so that it does not affect the audio signaling through the integrated circuit terminal DP/N. Transistor M2 and the turn-off helper transistor M3 may both be thick-gate-oxide devices to protect them from any voltage strain during the high-speed data and audio modes of operation.

A method of controlling an audio pass transistor in accordance with the disclosure will now be discussed with respect to the flowchart of FIG. 3. The method occurs during the high-speed data mode of operation and includes an act 300 of coupling a gate of the audio pass transistor through a resistor to ground. The coupling of the gate of the audio pass transistor M1 to ground through switch S5 and resistor R is an example of act 300. The method also includes an act 305 of driving a high-speed data signal through an integrated circuit terminal coupled to the audio pass transistor to charge the integrated circuit terminal with a negative voltage. The negative charging of the integrated circuit terminals DP, DN (or the generic DP/N terminal) is an example of act 305. Finally, the method includes an act 310 of coupling the negative voltage through a first transistor coupled between the integrated circuit terminal and the gate of the audio pass transistor to maintain the audio pass transistor off during the high-speed data mode of operation. The coupling through the turn-off helper transistor M3 is an example of act 310.

An audio pass transistor turn-off circuit as disclosed herein may be incorporated in any suitable mobile device or electronic system. For example, as shown in FIG. 4, a cellular telephone 400, a laptop computer 405, and a tablet PC 410 may all include an audio pass transistor turn-off circuit in accordance with the disclosure. Other exemplary electronic systems such as a music player, a video player, a communication device, and a personal computer may also be configured with an audio pass transistor turn-off circuit constructed in accordance with the disclosure.

The disclosure will now be summarized in the following series of clauses:

Clause 1. An integrated circuit, comprising:
an integrated circuit terminal;
an audio pass transistor having a first drain/source terminal coupled to the integrated circuit terminal; and
a first transistor having a first drain/source terminal coupled to a gate of the audio pass transistor and having a second drain/source terminal coupled to the integrated circuit terminal.

Clause 2. The integrated circuit of clause 1, further comprising:
a resistor coupled to ground; and
a first switch configured to couple the gate of the audio pass transistor to ground through the resistor during a high-speed data mode of operation for the integrated circuit.

Clause 3. The integrated circuit of clause 2, further comprising:
a switch linearizer circuit, wherein the first switch is also configured to couple the gate of the audio pass transistor to the switch linearizer circuit during an audio mode of operation for the integrated circuit.

Clause 4. The integrated circuit of any of clauses 2-3, further comprising:
a second switch configured to couple a gate of the first transistor to ground during the high-speed data mode of operation.

Clause 5. The integrated circuit of clause 4, further comprising:
a negative voltage source, wherein the second switch is further configured to couple the gate of the first transistor to the negative voltage source during an audio mode of operation for the integrated circuit.

Clause 6. The integrated circuit of any of clauses 1-5, further comprising:
an audio source for an audio signal coupled to a second drain/source terminal of the audio pass transistor.

Clause 7. The integrated circuit of any of clauses 1-6, further comprising:
a second transistor, wherein the second drain/source terminal of the first transistor is coupled through the second transistor to the integrated circuit terminal.

Clause 8. The integrated circuit of claim 7, wherein a gate of the second transistor is biased with a positive voltage so as to be conductive during both an audio mode of operation for the integrated circuit and a high-speed data mode of operation for the integrated circuit.

Clause 9. The integrated circuit of any of clauses 1-8, wherein the first transistor and the audio pass transistor each comprises an n-type metal-oxide-semiconductor (NMOS) transistor.

Clause 10. The integrated circuit of any of clauses 1-9, wherein the integrated circuit terminal is a data terminal for a universal serial bus (USB) interface of the integrated circuit.

Clause 11. The integrated circuit of clause 10, wherein the USB interface is a USB-C interface.

Clause 12. The integrated circuit of any of clauses 1-11, wherein the integrated circuit is included within a cellular telephone.

Clause 13. The integrated circuit of clause 7, wherein the first transistor and the second transistor are each thick-gate-oxide NMOS transistors.

Clause 14. A method of controlling an audio pass transistor, comprising:
during a high-speed data mode of operation:

coupling a gate of the audio pass transistor through a resistor to ground;

driving a high-speed data signal through an integrated circuit terminal coupled to the audio pass transistor to charge the integrated circuit terminal with a negative voltage; and coupling the negative voltage through a first transistor coupled between the integrated circuit terminal and the gate of the audio pass transistor to maintain the audio pass transistor off during the high-speed data mode of operation.

Clause 15. The method of clause 14, further comprising:

grounding a gate of the first transistor during the high-speed data mode of operation.

Clause 16. The method of clause 14, further comprising:

coupling a gate of the audio pass transistor to a switch linearizer circuit during an audio mode of operation, and driving audio signals through the audio pass transistor to the integrated circuit terminal during the audio mode of operation.

Clause 17. The method of clause 16, further comprising:

biasing a gate of the first transistor with a negative voltage during the audio mode of operation.

Clause 18. An integrated circuit, comprising:

an integrated circuit terminal;

an audio source for an audio signal;

an audio pass transistor coupled between the audio source and the integrated circuit terminal;

a resistor coupled to ground;

a first switch configured to couple a gate of the audio pass transistor to ground through the resistor during a high-speed data mode of operation for the integrated circuit; and means for coupling a negative charge on the integrated circuit terminal to a gate of the audio pass transistor during the high-speed data mode of operation.

Clause 19. The integrated circuit of clause 18, further comprising:

a switch linearizer circuit, wherein the first switch is further configured to couple the gate of the audio pass transistor to the switch linearizer circuit during an audio mode of operation for the integrated circuit.

Clause 20. The integrated circuit of any of clauses 18-19, wherein the audio source has a capacitance, and wherein the means for coupling the negative charge is configured to substantially isolate the integrated circuit terminal from the capacitance during the high-speed data mode of operation.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. An integrated circuit, comprising:

an integrated circuit terminal configured to pass a data signal during a data mode of operation and to pass an audio signal during an audio mode of operation;

an audio pass transistor having a first terminal connected to the integrated circuit terminal and a second terminal connected to an audio source;

a first transistor having a first terminal connected through a second transistor to a gate of the audio pass transistor and having a second terminal connected to the integrated circuit terminal;

the second transistor, wherein the first terminal of the first transistor is connected through the second transistor to the gate of the audio pass transistor, and the second transistor is configured to be held in an on state both during the audio mode of operation and during the data mode of operation;

a first switch configured to either connect the gate of the audio pass transistor to:

a ground through a resistor during the data mode of operation, or a circuit that drives the gate of the audio pass transistor with a positive voltage during the audio mode of operation; and a second switch configured to either connect a gate of the first transistor to:

the ground during the data mode of operation, or a negative voltage source during the audio mode of operation, and the first transistor is located between the second switch and the second transistor.

2. The integrated circuit of claim 1, wherein the first transistor and the audio pass transistor each comprises an n-type metal-oxide-semiconductor (NMOS) transistor.

3. The integrated circuit of claim 1, wherein the integrated circuit terminal is a data terminal for a universal serial bus (USB) interface of the integrated circuit.

4. The integrated circuit of claim 3, wherein the USB interface is a USB-C interface.

5. The integrated circuit of claim 1, wherein the integrated circuit is included within a cellular telephone.

6. The integrated circuit of claim 1, wherein the first transistor and the second transistor each comprises a thick-gate-oxide n-type metal-oxide-semiconductor (NMOS) transistor.

7. A method of controlling an audio pass transistor having a first terminal connected to an integrated circuit terminal, and a second terminal connected to an audio source, the integrated circuit terminal configured to, by operation of a first switch and a second switch, pass a data signal during a data mode of operation and to pass an audio signal during an audio mode of operation, comprising:

in response to the first switch being in a first switch first position and the second switch being in a second switch first position during the data mode of operation:

connecting a gate of the audio pass transistor:

to a shunt resistor to a ground through the first switch, and to a first terminal of a first transistor through a second transistor, connecting a second terminal of the first transistor to the integrated circuit terminal, connecting a gate of the first transistor to the ground through the second switch, and maintaining the audio pass transistor in an off state in response to receiving a negative going voltage at the integrated circuit terminal; and in response to the first switch being in a first switch second position and the second switch being in a second switch second position during the audio mode of operation:

connecting the gate of the audio pass transistor;

to a circuit, through the first switch, configured to drive the gate of the audio pass transistor with a positive voltage configured to linearly pass an audio signal through the audio pass transistor to the integrated circuit terminal, and to the first terminal of a first transistor through the second transistor, connecting the second terminal of the first transistor to the integrated circuit terminal, and connecting the gate of the first transistor to a negative voltage source through the second switch, wherein the first transistor is located between the second switch and the second transistor.

8. The integrated circuit of claim 1, wherein the circuit that drives the gate of the audio pass transistor with the positive voltage biases the audio pass transistor to linearly pass the audio signal through the audio pass transistor during the audio mode of operation for the integrated circuit.

9. The method of claim 7, wherein the first transistor and the audio pass transistor each comprises an n-type metal-oxide-semiconductor (NMOS) transistor.

10. The method of claim 7, wherein the integrated circuit terminal is a data terminal for a universal serial bus (USB) interface.

11. The method of claim 10, wherein the USB interface is a USB-C interface.

12. The method of claim 7, wherein the integrated circuit terminal is included within a cellular telephone.

13. The method of claim 7, wherein the first transistor comprises a thick-gate-oxide n-type metal-oxide-semiconductor (NMOS) transistor.

* * * * *